US008427896B1

(12) United States Patent
Agarwal et al.

(10) Patent No.: US 8,427,896 B1
(45) Date of Patent: Apr. 23, 2013

(54) DYNAMIC WORDLINE ASSIST SCHEME TO IMPROVE PERFORMANCE TRADEOFF IN SRAM

(75) Inventors: Pankaj Agarwal, Uttar Pradesh (IN); Vaibhav V. Prabhu, Karnataka (IN); Krishnan S. Rengarajan, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/296,724

(22) Filed: Nov. 15, 2011

(51) Int. Cl.
*G11C 7/02* (2006.01)

(52) U.S. Cl.
USPC . 365/206; 365/154; 365/189.15; 365/189.16; 365/189.09; 365/191

(58) Field of Classification Search ............ 365/154, 365/189.15, 189.16, 189.09, 194
See application file for complete search history.

(56) References Cited

U.S. PATENT DOCUMENTS

| 7,366,006 | B2 * | 4/2008 | Zhang | 365/154 |
|---|---|---|---|---|
| 7,379,354 | B2 * | 5/2008 | Heinrich-Barna et al. | 365/189.16 |
| 7,400,523 | B2 * | 7/2008 | Houston | 365/154 |
| 7,515,489 | B2 * | 4/2009 | Wong | 365/189.09 |
| 7,570,525 | B2 * | 8/2009 | Nii et al. | 365/189.11 |
| 7,636,268 | B1 * | 12/2009 | Peng | 365/206 |
| 7,660,150 | B2 * | 2/2010 | Mikan et al. | 365/154 |
| 7,733,686 | B2 * | 6/2010 | Clinton | 365/154 |
| 7,817,481 | B2 * | 10/2010 | Adams et al. | 365/154 |
| 7,864,600 | B2 * | 1/2011 | Mikan et al. | 365/189.14 |
| 7,864,617 | B2 * | 1/2011 | Kenkare | 365/226 |
| 7,903,483 | B2 * | 3/2011 | Russell et al. | 365/200 |
| 8,004,907 | B2 * | 8/2011 | Russell et al. | 365/189.011 |
| 8,045,402 | B2 * | 10/2011 | Yeung | 365/189.16 |
| 8,059,482 | B2 * | 11/2011 | Russell et al. | 365/226 |
| 8,228,713 | B2 * | 7/2012 | Arsovski et al. | 365/154 |
| 8,233,342 | B2 * | 7/2012 | Adams et al. | 365/203 |
| 2007/0279965 | A1 | 12/2007 | Nakazato et al. | |
| 2009/0103375 | A1 | 4/2009 | Houston | |
| 2010/0188886 | A1 | 7/2010 | Behrends et al. | |
| 2011/0103137 | A1 | 5/2011 | Beat | |
| 2012/0134220 | A1 * | 5/2012 | Kim et al. | 365/189.11 |
| 2012/0170388 | A1 * | 7/2012 | Choi | 365/189.16 |

FOREIGN PATENT DOCUMENTS

| JP | 2005117037 A | 4/2005 |
|---|---|---|
| WO | 2008097783 A2 | 8/2008 |

OTHER PUBLICATIONS

Ohbayashi et al., "A 65-nm SoC Embedded 6T-SRAM Designed for Manufacturability With Read and Write Operation Stabilizing Circuits", IEEE Journal of Solid-State Circuits, vol. 42, No. 4, Apr. 2007, pp. 820-829.

Zhang et al., "A 3.8 GHz 153 Mb SRAM Design With Dynamic Stability Enhancement and Leakage Reduction in 45 nm High-K Metal Gate CMOS Technology", IEEE Journal of Solid-State Circuits, Jan. 2009, Issue 1, pp. 148-154, abstract.

* cited by examiner

*Primary Examiner* — Viet Q Nguyen
(74) *Attorney, Agent, or Firm* — Hoffman Warnick LLC; David A. Cain

(57) ABSTRACT

A dynamic wordline assist circuit for improving performance of an SRAM. An SRAM is disclosed that includes a plurality of memory cells, wherein each memory cell is coupled to a wordline and a pair of bitlines; and a wordline assist circuit coupled to the wordline, wherein the wordline assist circuit includes a first input for activating the wordline assist circuit during a read or write cycle and includes a second input for deactivating the wordline assist circuit during the read or write cycle after a delay.

20 Claims, 5 Drawing Sheets

US 8,427,896 B1

DYNAMIC WORDLINE ASSIST SCHEME TO IMPROVE PERFORMANCE TRADEOFF IN SRAM

BACKGROUND

The present invention relates to static random-access memory (SRAM) and more particularly to a wordline stability assist scheme to improve the tradeoff between cell stability due to read disturb and writeability.

The popular 6T SRAM cell, which utilizes six transistors to store a memory bit and is the industry workhorse today, has always been a challenge for scaling from one technology to the next. Designing the memory for an acceptable yield for cell stability and writeability to the cell has been a challenge under today's constraints of low voltage operation, very high process variation, large amount of memory on die, and area efficiency (or cost per bit). Various techniques have been proposed in the prior art, each having a tradeoff in one way or the other. Some approaches have even moved away from the 6T cell at a high cost of area efficiency.

BRIEF SUMMARY

Described herein is an enhancement of a wordline stability assist scheme to improve the tradeoff between cell stability and readability/writeability.

In a first aspect, the present invention provides a static random access memory (SRAM) device, comprising: a plurality of memory cells, wherein each memory cell is coupled to a wordline and a pair of bitlines; and a wordline assist circuit coupled to the wordline, wherein the wordline assist circuit includes a first input for activating the wordline assist circuit during a read or write cycle and includes a second input for deactivating the wordline assist circuit during the read or write cycle after a delay.

In a second aspect, the invention provides a wordline assist circuit for enhancing performance of a static random access memory (SRAM) device, comprising: a control node for controlling a wordline associated with a plurality of memory cells; a first input for activating the wordline assist circuit during a read or write cycle; and a second input for deactivating the wordline assist circuit during the read or write cycle after a delay; wherein, upon activation, the wordline assist circuit limits a supply at the wordline provided by a wordline driver.

In a third aspect, the invention provides a method for improving performance of a static random access memory (SRAM) device, comprising: providing an SRAM device with a plurality of memory cells, wherein each cell is coupled to a wordline and a pair of bitlines; activating a wordline assist during a read or write cycle, wherein the wordline assist limits a supply at the wordline to improve stability; and deactivating the wordline assist during the read or write cycle after a delay to improve associated reading or writing performance.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings.

Figure 1:
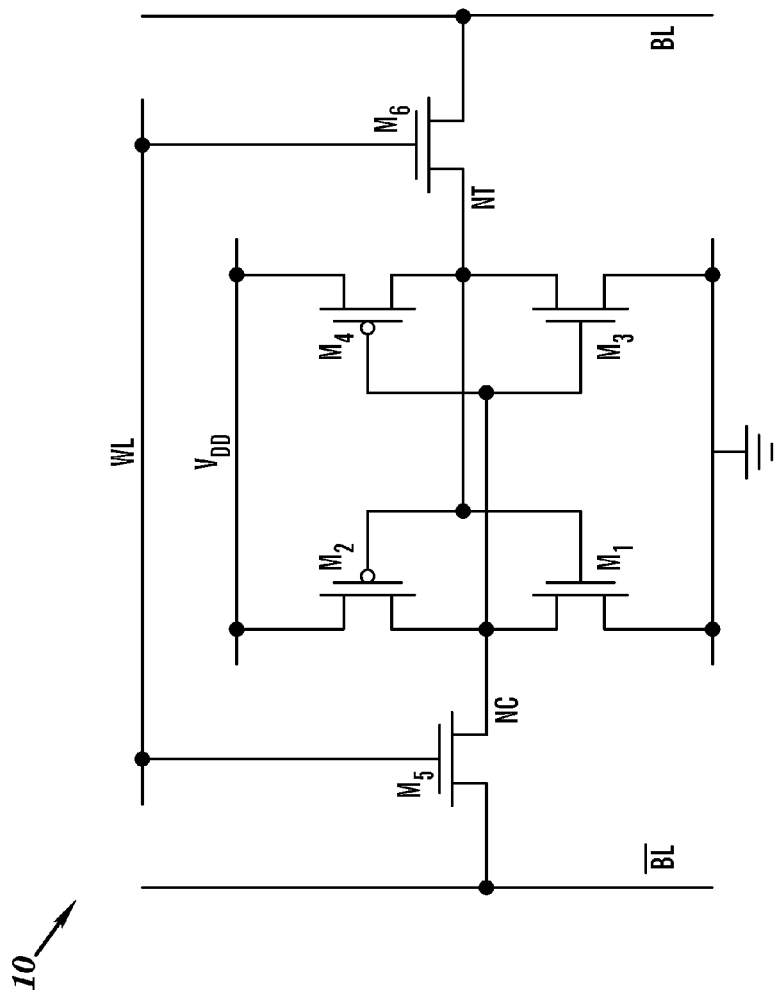
FIG. 1 depicts a 6T SRAM cell.

The drawings are merely schematic representations, not intended to portray specific parameters of the invention. The drawings are intended to depict only typical embodiments of the invention, and therefore should not be considered as limiting the scope of the invention. In the drawings, like reference numbering represents like elements.

DETAILED DESCRIPTION

FIG. 1 depicts an illustrative 6T SRAM cell 10. Operations of such cells are well understood in the art and therefore are not described in detail. In general, a write operation occurs by placing opposite values on the bit lines, and asserting the wordline WL, which causes the values to be stored in the cell. A read operation generally includes precharging both bitlines to a logical 1, then asserting the word line WL. A sense amplifier coupled to the bit lines evaluates the result.

As noted, there tends to be a performance conflict between stability and readability/writeability in such cells. Techniques are known to increase stability, which has the adverse affect of decreasing readability/writeability. Similarly, techniques are known to increase readability/writeability, which has the adverse effect of decreasing stability. The present approach utilizes a dynamic assist circuit coupled to the wordline WL to achieve both improved stability and readability/writeability. In particular, the circuit dynamically lowers the wordline WL to improve stability, but also boosts the wordline WL to negative levels to improve readability/writeability.

Figure 2:
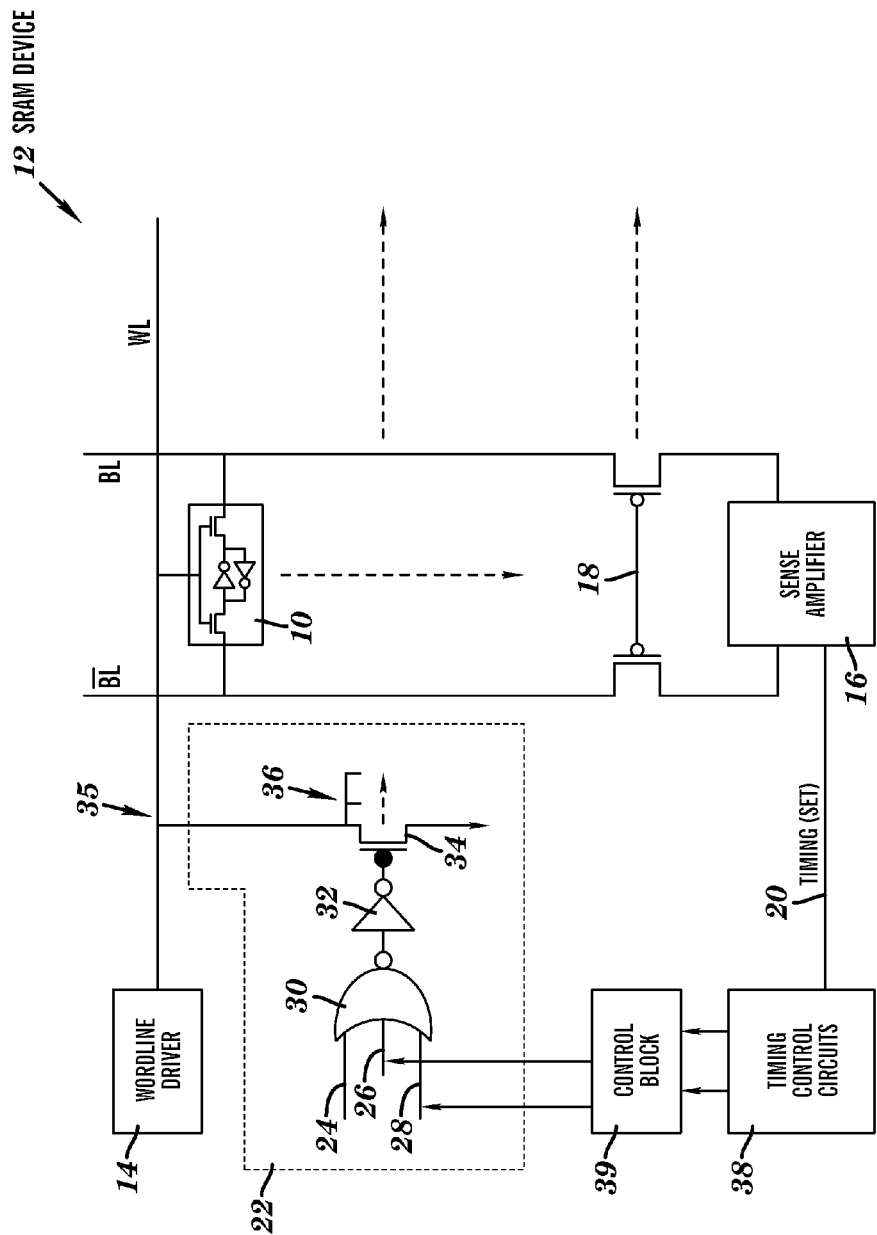
FIG. 2 depicts a schematic of a portion of a 6T SRAM device having an assist circuit in accordance with an embodiment of the invention.

FIG. 2 shows an SRAM device 12 (in partial detail) having a dynamic wordline assist circuit 22. In particular, SRAM device 12 includes a wordline driver 14 that activates/deactivates wordline WL. Cells 10 are arranged in columns and rows, with each column being coupled to a bit line BL (and its inverse) and selected by a column select input 18. A sense amplifier 16 is coupled to each column, and is controlled by timing input 20. For the purposes of describing illustrative embodiments, much of the SRAM device 12 is omitted from the illustration. It is recognized that the operation of an SRAM device is well understood by those skilled in the art.

In order to achieve better stability and writeability, wordline assist circuit 22 is utilized to dynamically alter the behavior of the wordline WL. Wordline assist circuit 22 generally includes a NOR gate 30 with three inputs coupled to an inverter 32, which in turn controls the gate of a PFET 34. The source and drain of the PFET 34 are coupled to multiple PFET pulldown legs 36 and ground, respectively. Pulldown legs 36 are in turn coupled to a control node 35 on the wordline WL. The PFET 34, when activated, will degrade the high level of the wordline WL by a small voltage (e.g., 1-50 mV) depending upon the number of pulldown legs 36 turned on.

The assist circuit 22 as shown includes three inputs, including: (1) an assist activation input 24; (2) a read control input 26; and (3) a write control input 28. When the assist circuit 22 is activated, i.e., PFET 34 is turned on, the wordline driver 14 is pulled down, or limited, to increase stability. To improve performance during both read and write operations, the assist circuit 22 is turned off, i.e., deactivated, shortly after the wordline WL is turned on. This can be achieved with the described circuitry, e.g., by providing an appropriate signal on the read control 26 and/or write control inputs 28. The slight delay allows the bitlines BL to discharge some, thus providing relief for cell stability and improving the readability/writeability margin. The amount of delay in releasing the wordline assist circuit 22 can be designed to achieve an optimal amount of stability and readability/writeability.

The assist activation input 24 may for example be activated based on silicon measurements from a calibrating macro (not shown). These measurements would indicate whether stability assist should be engaged. Once the decision is made, the assist activation input 24 is turned ON through, e.g., an efuse (the efuse is programmed once the decision is made, so every time the chip comes on, the value is downloaded from the efuse). Accordingly, the assist activation input 24 is a static input. As shown in FIG. 2, it is an active low signal, i.e., 0, when stability assist is ON and 1 when stability assist is OFF.

Note that each of the pulldown legs 36 is controlled by signals similar to assist activation input 24. Depending on silicon measurements of the calibration macro, the degree of stability assist needed can vary from small to large, and correspond to lowering the wordline WL by small to large amounts respectively. Correspondingly, one or more of these pulldown legs 36 would be turned ON. If more are turned ON, the resistance of the pull down path would decrease, and the WL level will become lower. It is recognized that the circuitry shown for implementing wordline assist circuit 22 is an illustrative embodiment for providing the functionality described herein. Accordingly, other circuits for performing such functions could likewise be utilized and fall within the scope of the invention.

Read and write control inputs 26, 28 are obtained from a control block 39 in response to timing control circuits 38. The read and write control inputs 26, 28 cause the assist circuit 22 to be deactivated (i.e., by inputting a logic 1) a short time after assist circuit 22 is activated. The delay is obtained from existing timing signals on the SRAM device 12. Timing control circuits 38 are utilized to generate sense amp enable and write assist controls for the output and input datapaths respectively. The time to turn on the sense amplifier 16 is about the time the bitlines have a sufficiently signal developed. With this signal development (70 mV at slow corners, much higher at fast corners where stability is a concern), the cell is out of the danger region for stability, so the READ signal from timing control circuits 38 can be used as the read control input 26 to release the stability assist on the wordline WL. Depending upon the particular implementation, a typical delay may be on the order of 100-300 ps.

For the write cycle, write control input 26 can be derived from the WRITE signal, but delayed to be same as the READ trigger would be during the READ cycle to protect half selected columns during a write operation. The WRITE signal too may be used, if the timing is as good.

Figure 3:
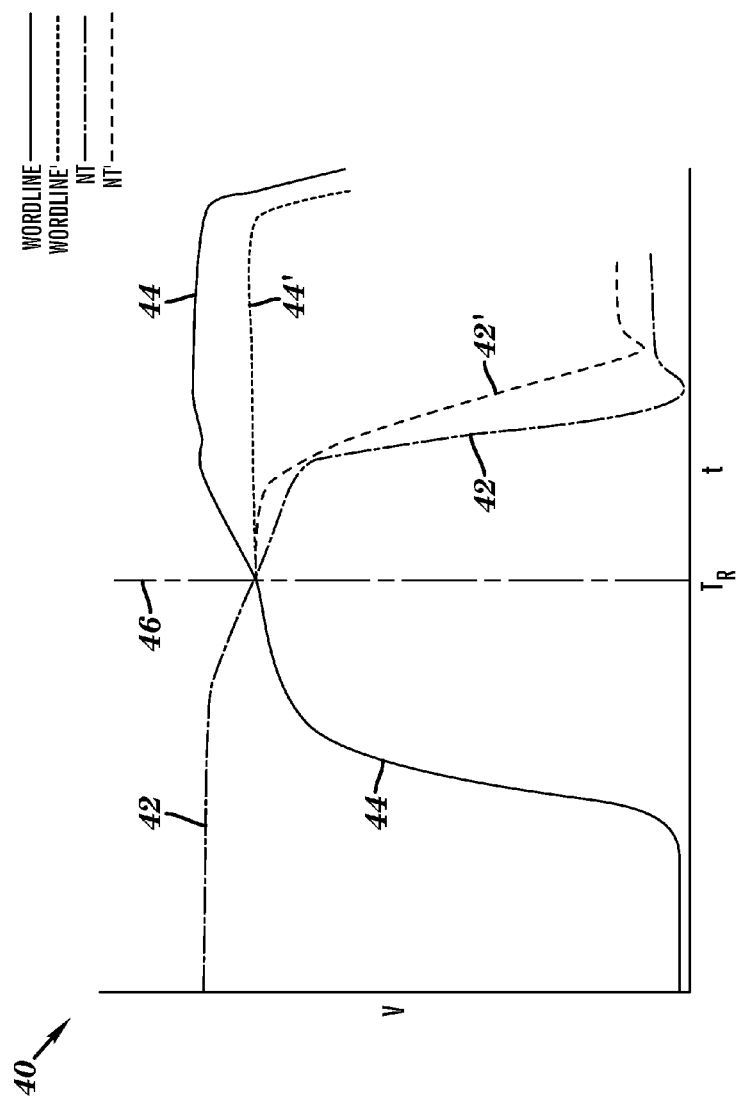
FIG. 3 depicts a timing diagram of a write operation showing improved performance and stability in accordance with an embodiment of the present invention.

FIG. 3 depicts an illustrative timing diagram of a write operation showing the behavior of wordline WL 44 and node NT 42 (FIG. 1) after the WL assist is released (i.e., deactivated) at delay $T_D$. Traces 44' and 42' depict the behaviors of the wordline WL and node NT without deactivation of the WL assist. As can be seen, NT 42 flips sooner relative to NT 42' when the assist is deactivated. In addition, it can be seen that WL 44 remains stable.

Figure 4:
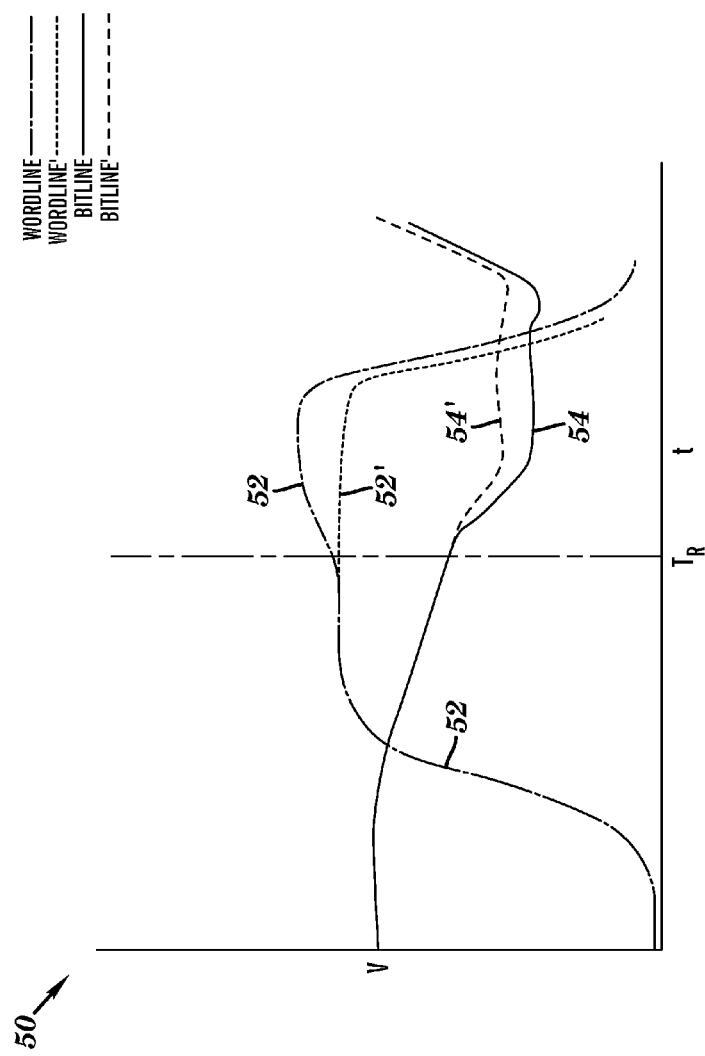
FIG. 4 depicts a timing diagram of a read operation showing improved performance and stability in accordance with an embodiment of the present invention.

FIG. 4 depicts an illustrative timing diagram of a read operation showing the behavior of wordline WL 52 and bitline BL 54 (see FIG. 1) after the WL assist is released (i.e., deactivated) at $T_D$. Traces 52' and 54' depict the behaviors of the wordline WL and node NT without deactivation of the WL assist. Here again, it can be seen that BL 54 outperforms BL 54' and WL 52 remains stable throughout.

Figure 5:
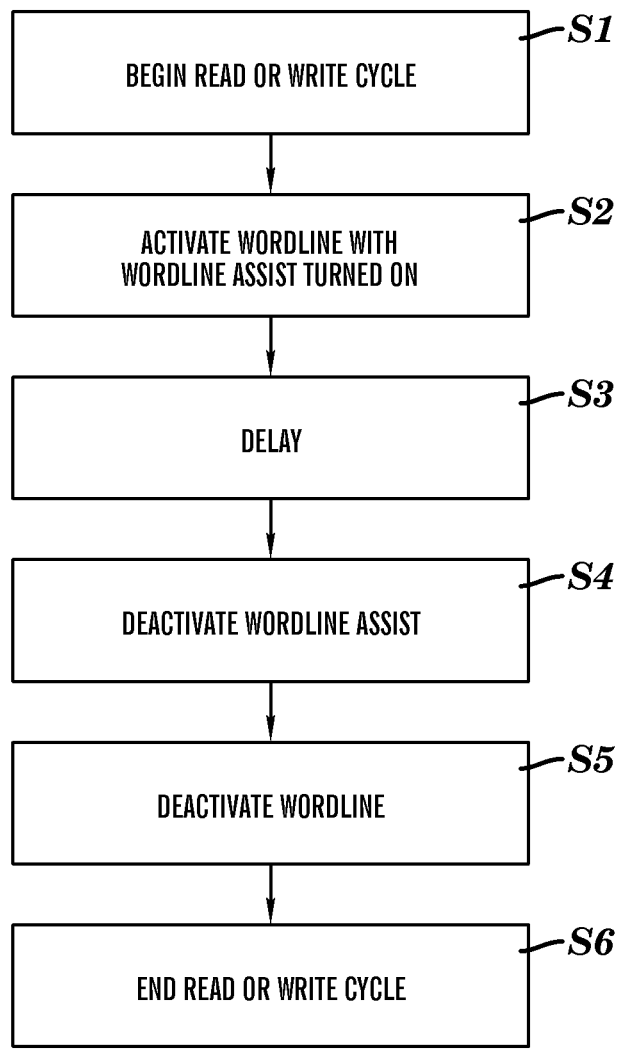
FIG. 5 depicts a flow chart showing a method for implementing dynamic wordline assist in accordance with an embodiment of the present invention.

FIG. 5 depicts a flowchart for implementing dynamic wordline assist for an SRAM device. At S1, a read or write cycle begins, and at S2 the wordline is activated with wordline assist turned on to enhance stability. (As noted above, the decision to turn wordline assist on is typically an on-chip stored decision based on silicon testing at manufacturing.) At S4 a delay occurs to allow the bitlines to partially discharge. After the delay, the wordline assist is deactivated at S4 for the remainder of the cycle. At S5, the wordline is deactivated and at S6 the current read or write cycle ends.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. For example, although generally described with reference to a 6T SRAM, it is understood that the present invention may be utilized with other memory variations, including dual port cell based memory. It is also understood that the features of the invention may be applied to just read operations, just write operations, or both operations.

In addition, as will be appreciated by one skilled in the art, aspects of the present invention may be embodied as a system, method or computer program product/netlist. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "computer" or "system." Furthermore, aspects of the present invention may take the form of a netlist embodied and stored in an electronic storage medium and/or computer program product embodied in one or more computer readable medium(s) having computer readable program code embodied thereon.

What is claimed is:

1. A static random access memory (SRAM) device, comprising:
    a plurality of memory cells, wherein each memory cell is coupled to a wordline and a pair of bitlines; and
    a wordline assist circuit coupled to the wordline, wherein the wordline assist circuit includes a first input for activating the wordline assist circuit during a read or write cycle and includes a second input for deactivating the wordline assist circuit during the read or write cycle after a delay.

2. The SRAM device of claim 1, wherein the delay occurs after the bitlines have partially discharged.

3. The SRAM device of claim 1, wherein the wordline assist circuit is deactivated during a read cycle by a read timing control circuit utilized to control read operations on the SRAM device.

4. The SRAM device of claim 1, wherein the wordline assist circuit is deactivated during a write cycle with a signal derived from a write timing control circuit utilized to control write operations on the SRAM device.

5. The SRAM device of claim 4, wherein the signal derived from the write timing control circuit is based on a delay associated with a read timing control circuit.

6. The SRAM device of claim 1, wherein the wordline assist circuit includes a PFET having a gate controlled by a NOR gate and an inverter, a source coupled to ground, and a drain coupled to the wordline and a plurality of pulldown legs.

7. The SRAM device of claim 6, further comprising a control block for converting timing control signals into input signals for the wordline assist circuit.

8. A wordline assist circuit for enhancing performance of a static random access memory (SRAM) device, comprising:
- a control node for controlling a wordline associated with a plurality of memory cells;
- a first input for activating the wordline assist circuit during a read or write cycle; and
- a second input for deactivating the wordline assist circuit during the read or write cycle after a delay;
- wherein, upon activation, the wordline assist circuit limits a supply at the wordline provided by a wordline driver.

9. The wordline assist circuit of claim 8, wherein the delay occurs after a pair of selected bitlines have partially discharged.

10. The wordline assist circuit of claim 8, wherein the wordline assist circuit is deactivated during a read cycle by a read timing control circuit utilized to control read operations on the SRAM device.

11. The wordline assist circuit of claim 8, wherein the wordline assist circuit is deactivated during a write cycle with a signal derived from a write timing control circuit utilized to control write operations on the SRAM device.

12. The wordline assist circuit of claim 11, wherein the signal derived from the write timing control circuit is based on a delay associated with a read timing control circuit.

13. The wordline assist circuit of claim 8, wherein the wordline assist circuit includes a PFET having a gate controlled by a NOR device and an inverter, a source coupled to ground, and a drain coupled to the control node and a plurality of pulldown legs.

14. The wordline assist circuit of claim 13, further comprising a control block for converting timing control signals into input signals for the wordline assist circuit.

15. A method for improving performance of a static random access memory (SRAM) device, comprising:
- providing an SRAM device with a plurality of memory cells, wherein each cell is coupled to a wordline and a pair of bitlines;
- activating a wordline assist using a first input during a read or write cycle, wherein the wordline assist limits a supply at the wordline to improve stability; and
- deactivating the wordline assist using a second input during the read or write cycle after a delay to improve associated reading or writing performance.

16. The method of claim 15, wherein the delay occurs after the bitlines have partially discharged.

17. The method of claim 15, wherein the wordline assist is deactivated during a read cycle by a read timing control circuit utilized to control read operations on the SRAM device.

18. The method of claim 15, wherein the wordline assist circuit is deactivated during a write cycle with a signal derived from a write timing control circuit utilized to control write operations on the SRAM device.

19. The method of claim 18, wherein the signal derived from the write timing control circuit is based on a delay associated with a read timing control circuit.

20. The method of claim 15, wherein the wordline assist is implemented with a circuit that includes a PFET having a gate controlled by a NOR gate and an inverter, a source coupled to ground, and a drain coupled to the wordline and a plurality of pulldown legs.

* * * * *